(12) United States Patent
Dai et al.

(10) Patent No.: US 7,705,647 B2
(45) Date of Patent: Apr. 27, 2010

(54) DUTY CYCLE CORRECTION CIRCUIT

(75) Inventors: Liang Dai, Carlsbad, CA (US); Lam V. Nguyen, Cupertino, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/454,426

(22) Filed: Jun. 14, 2006

(65) Prior Publication Data

US 2007/0290730 A1    Dec. 20, 2007

(51) Int. Cl.
   *H03K 3/017*    (2006.01)
(52) U.S. Cl. ........................ 327/175; 327/170
(58) Field of Classification Search ................. None
   See application file for complete search history.

(56) References Cited

U.S. PATENT DOCUMENTS

| | | | | |
|---|---|---|---|---|
| 5,896,053 A * | 4/1999 | Prentice | ...................... | 327/255 |
| 5,945,862 A * | 8/1999 | Donnelly et al. | ............. | 327/278 |
| 6,084,452 A * | 7/2000 | Drost et al. | .................. | 327/175 |
| 6,198,322 B1 | 3/2001 | Yoshimura | | |
| 6,320,438 B1 * | 11/2001 | Arcus | ......................... | 327/175 |
| 6,456,133 B1 | 9/2002 | Nair et al. | | |
| 6,501,313 B2 * | 12/2002 | Boerstler et al. | ............ | 327/175 |
| 6,542,015 B2 | 4/2003 | Zhou et al. | | |
| 6,654,900 B1 | 11/2003 | Cave | | |
| 6,680,637 B2 | 1/2004 | Seo | | |
| 6,683,494 B2 * | 1/2004 | Stanley | ......................... | 330/10 |
| 6,967,514 B2 * | 11/2005 | Kizer et al. | .................. | 327/175 |
| 7,202,722 B2 | 4/2007 | Mahadevan et al. | | |
| 2005/0285649 A1 * | 12/2005 | Chun et al. | ................. | 327/172 |
| 2006/0028256 A1 * | 2/2006 | Nam et al. | ................... | 327/172 |

OTHER PUBLICATIONS

International Search Report - PCT/US07/069883, International Search Authority - European Patent Office - Feb. 5, 2008.

* cited by examiner

*Primary Examiner*—Cassandra Cox
(74) *Attorney, Agent, or Firm*—Jiayu Xu

(57) ABSTRACT

A duty cycle correction circuit capable of generating a clock signal having good (e.g., approximately 50%) duty cycle is described. The duty cycle correction circuit includes a clock deskew circuit and a duty cycle detection circuit. The clock deskew circuit receives an input clock signal that may have poor duty cycle, adjusts the input clock signal based on a control, and provides an output clock signal having an adjustable duty cycle. The duty cycle detection circuit detects error in the duty cycle of the output clock signal and generates the control in response to the detected error in the duty cycle. The clock deskew circuit and the duty cycle detection circuit implement a feedback loop that senses error in the duty cycle of the output clock signal and feeds back the control to correct the duty cycle error.

18 Claims, 7 Drawing Sheets

DUTY CYCLE CORRECTION CIRCUIT

BACKGROUND

I. Field

The present invention relates generally to electronics circuits, and more specifically to clock generation/distribution circuitry.

II. Background

Clock signals are commonly used in many electronics circuits and for various purposes. For example, clock signals are used to trigger synchronous circuits (e.g., flip-flops) in digital circuits such as processors, memory devices, and so on. Clock signals may be generated with various types of oscillator and supporting circuitry.

A clock signal continually transitions between logic high and logic low. The clock signal has a duty cycle that is determined by the time duration at logic high and the time duration at logic low. It is desirable to generate the clock signal to have a duty cycle that is as close to 50% as possible, so that the logic high duration is close to the logic low duration. A digital circuit may use both the rising and falling edges of the clock signal to trigger synchronous circuits to achieve faster operating speed. A 50% duty cycle for the clock signal may then provide the synchronous circuits with maximum timing margins.

The duty cycle of a clock signal may be distorted due to various phenomena such as mismatches in transistor devices used to generate the clock signal. Great care is often used in designing clock generation and distribution circuits to minimize device mismatches. Unfortunately, as device size shrinks in advanced integrated circuit (IC) process technologies, duty cycle distortion due to random variations and device mismatches becomes worse. Furthermore, digital circuits fabricated with advanced IC processes typically operate at high speed, e.g., one giga-Hertz (GHz) or higher. The high speed corresponds to a smaller clock period, e.g., 1 nanosecond (nsec) for 1 GHz. Small circuit mismatches may then translate to a relatively large error in duty cycle with the smaller clock period.

The clock duty cycle problem is often addressed by running an oscillator at twice the desired frequency and dividing an oscillator output signal by two to generate a clock signal with good duty cycle. However, this approach may be undesirable or inadequate for several reasons. First, more power is consumed to operate the oscillator and the divide-by-2 circuit at twice the desired frequency. Second, significant duty cycle distortion may still be present in the clock signal due to random device mismatches in the divide-by-2 circuit.

There is therefore a need in the art for techniques to efficiently generate a clock signal with good duty cycle.

SUMMARY

Techniques for efficiently generating a clock signal having good (e.g., approximately 50%) duty cycle are described herein. In an embodiment, a duty cycle correction circuit is disclosed which includes a clock deskew circuit and a duty cycle detection circuit. The clock deskew circuit (a first circuit) receives an input clock signal that may have poor duty cycle, adjusts the input clock signal based on a control, and provides an output clock signal having an adjustable duty cycle. The duty cycle detection circuit (a second circuit) detects error in the duty cycle of the output clock signal and generates the control in response to the detected error in the duty cycle. The clock deskew circuit and the duty cycle detection circuit implement a feedback loop that senses error in the duty cycle of the output clock signal and feeds back the control to correct the duty cycle error. These circuits may be implemented with various designs, and several exemplary embodiments are described below.

Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

Figure 1:
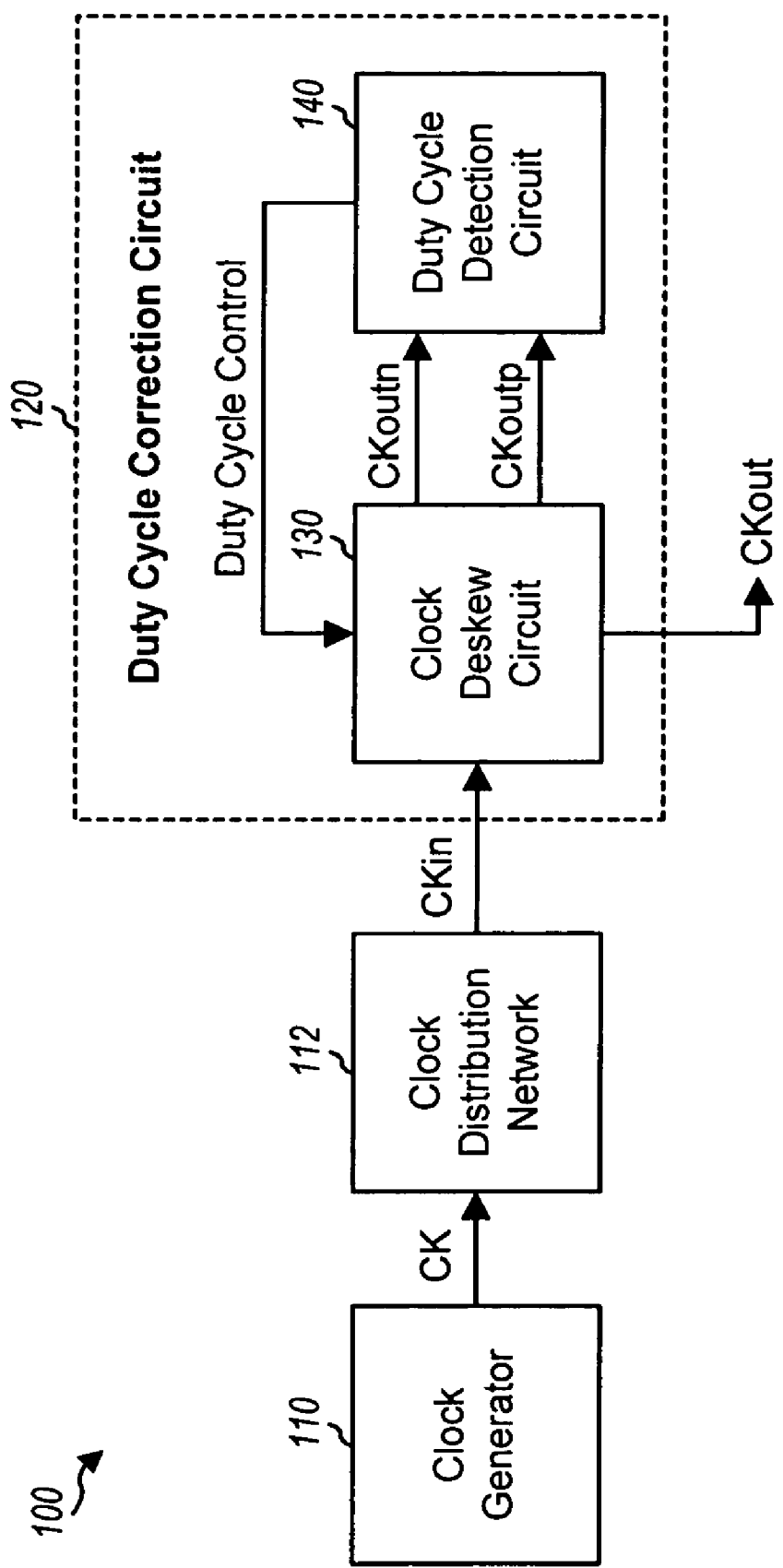
FIG. 1 shows a clock generation/distribution circuit with duty cycle correction.

FIG. 1 shows a block diagram of an embodiment of a clock generation/distribution circuit 100 with duty cycle correction. Clock generation/distribution circuit 100 includes a clock generator 110, a clock distribution network 112, and a duty cycle correction circuit 120. Clock generator 110 generates a clock signal, CK, having a duty cycle that may or may not be close to 50%. Clock generator 110 may include an oscillator such as a voltage controlled oscillator (VCO), a voltage controlled crystal oscillator (VCXO), a delay line oscillator, or some other type of oscillator. Clock generator 110 may also include a phase locked loop (PLL) that generates the clock signal having an accurate frequency determined by a reference signal. Clock distribution network 112 may include buffer circuits that receive and buffer the clock signal from clock generator 110 and provide an input clock signal, CKin, having a duty cycle that may or may not be close to 50%.

Duty cycle correction circuit 120 includes a clock deskew circuit 130 and a duty cycle detection circuit 140. Clock deskew circuit 130 receives the CKin signal from clock distribution network 112 and a duty cycle control from duty cycle detection circuit 140. In general, circuits 120 and 130 may receive the CKin signal from clock distribution network 112 (as shown in FIG. 1), the CK signal from clock generator 110, or a clock signal from some other source. Circuit 130 varies the duty cycle of the CKin signal based on the duty cycle control and generates a differential output clock signal, CKoutp and CKoutn, having a duty cycle close to 50%. Circuit 130 also generates a single-ended output clock signal, CKout, having similar duty cycle as the differential output clock signal. Duty cycle detection circuit 140 receives the CKoutp and CKoutn signals, detects the duty cycle of these signals, and generates the duty cycle control for clock deskew circuit 130.

Clock deskew circuit 130 and duty cycle detection circuit 140 may be implemented with various circuit designs. Furthermore, circuits 130 and 140 may be fabricated with various IC process technologies, including complementary metal oxide semiconductor (CMOS). CMOS uses both N-channel field effect transistors (N-FETs) and P-channel FETs (P-FETs). Several exemplary embodiments of circuits 130 and 140 are described below.

Figure 2:
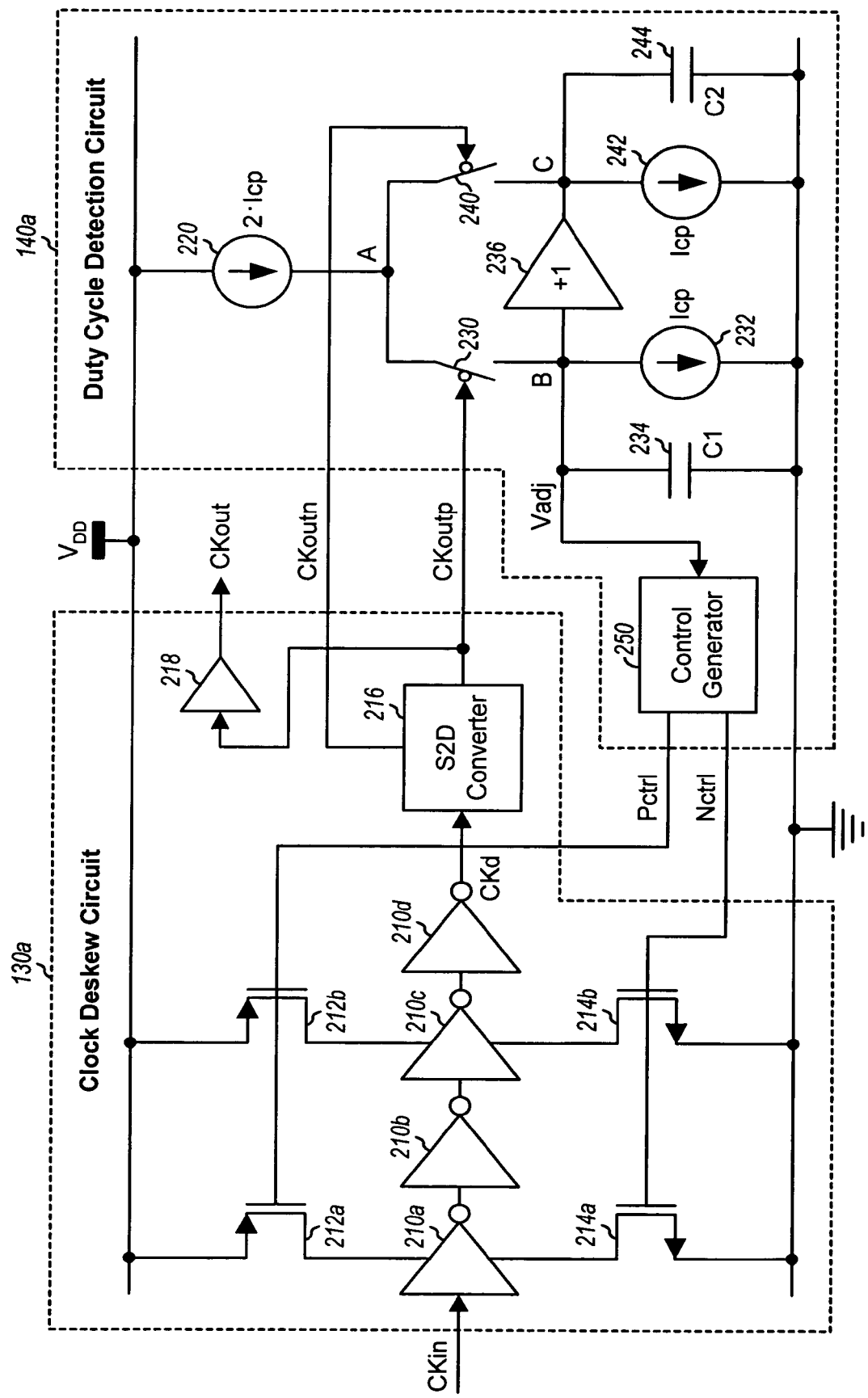
FIG. 2 shows a clock deskew circuit and a duty cycle detection circuit.

FIG. 2 shows a circuit diagram of a clock deskew circuit 130a and a duty cycle detection circuit 140a, which are an embodiment of clock deskew circuit 130 and duty cycle detection circuit 140 in FIG. 1.

Within clock deskew circuit 130a, four inverters 210a through 210d are coupled in series, with inverter 210a receiving the CKin signal and inverter 210d providing a deskewed clock signal, CKd. Pull-up P-FETs 212a and 212b have their sources coupled to a power supply voltage, $V_{DD}$, their gates coupled together and receiving a Pctrl control, and their drains coupled to inverters 210a and 210c, respectively. Pull-down N-FETs 214a and 214b have their sources coupled to circuit ground, their gates coupled together and receiving an Nctrl control, and their drains coupled to inverters 210a and 210c, respectively. The Pctrl and Nctrl controls are one embodiment of the duty cycle control from the duty cycle detection circuit to the clock deskew circuit. A single-ended to differential (S2D) converter 216 receives the CKd signal and generates the differential output clock signal, CKoutp and CKoutn. A buffer 218 buffers the CKoutp signal and provides the single-ended output clock signal, CKout.

Within duty cycle detection circuit 140a, a current source 220 has one end coupled to the supply voltage and the other end coupled to node A. A switch 230 couples between nodes A and B and receives the CKoutp signal at its control input. A current source 232 and a capacitor 234 are coupled in parallel and between node B and circuit ground. A switch 240 couples between nodes A and C and receives the CKoutn signal at its control input. A current source 242 and a capacitor 244 are coupled in parallel and between node C and circuit ground. Node B provides an adjust voltage, Vadj, used to adjust the duty cycle of the clock signal. Switch 230, current source 232, and capacitor 234 form the left branch for current source 220. Switch 240, current source 242, and capacitor 244 form the right branch for current source 220. A unity gain buffer 236 has its input coupled to node B and its output coupled to node C.

A control generator 250 receives the Vadj voltage and generates the Pctrl and Nctrl controls for clock deskew circuit 130a. In one embodiment, the Pctrl and Nctrl controls are set equal to the Vadj voltage, as follows:

Pctrl=Nctrl=Vadj. Eq (1)

In another embodiment, the Nctrl and Pctrl controls are level-shifted versions of the Vadj voltage, as follows:

Pctrl=Vadj−Offset1, and Eq (2)

Nctrl=Vadj+Offset2, Eq (3)

where Offset1 and Offset2 may be any suitable non-negative values. Control generator 250 may be implemented with a level shifter for the embodiment shown in equations (2) and (3). The Pctrl and Nctrl controls may also be generated in other manners.

Clock deskew circuit 130a operates as follows. P-FETs 212a and 212b determine the pull-up strength of inverters 210a and 210c, respectively, and control the slew rate of the rising edges of the output signals from inverters 210a and 210c, respectively. N-FETs 214a and 214b determine the pull-down strength of inverters 210a and 210c, respectively, and control the slew rate of the falling edges of the output signals from inverters 210a and 210c, respectively. As the Vadj voltage increases, N-FETs 214a and 214b are turned on harder, and a faster falling edge slew rate is obtained. Conversely, as the Vadj voltage decreases, P-FETs 212a and 212b are turned on harder, and a faster rising edge slew rate is obtained. By pulling down or up harder, the slew rates for the rising and falling edges may be varied, and different propagation delays may be achieved for the rising and falling edges. The duty cycle of the clock signal may thus be varied by adjusting P-FETs 212a and 212b and N-FETs 214a and 214b to obtain different slew rates and hence different propagation delays for the rising and falling edges.

The Pctrl and Nctrl controls may be generated as shown in equation (1). In this case, the same Vadj voltage is applied to P-FETs 212a and 212b as well as N-FETs 214a and 214b. The Pctrl and Nctrl controls may also be generated as shown in equations (2) and (3). In this case, the Pctrl and Nctrl controls are in-phase controls that are level-shifted versions of the Vadj voltage, which may provide better control characteristics over process, voltage, and temperature (PVT) variations.

In FIG. 2, variable slew rate control is applied to inverters 210a and 210c because the output signals from these inverters have the same polarity. Variable slew rate control may also be applied to inverters 210b and 210d using other controls that move in the opposite direction as the Vadj voltage. In general, variable slew rate control may be applied to any number of inverters to achieve the desired amount of duty cycle adjustment.

Duty cycle detection circuit 140a operates as follows. For the left branch, when the CKoutp signal is at logic low, switch 230 is turned on, and current source 220 provides a current of 2·Icp through switch 230. Current source 232 sinks a current of Icp, and the remaining current of Icp from current source 220 charges capacitor 234. Conversely, when the CKoutp signal is at logic high, switch 230 is turned off. Current source 232 then discharges capacitor 234 with a current of Icp. Thus, for the left branch, capacitor 234 is charged by current source 220 with a current of Icp when the CKoutp signal is at logic low and is discharged by current source 232 with a current of Icp when the CKoutp signal is at logic high. Similarly, for the right branch, capacitor 244 is charged by current source 220 with a current of Icp when the CKoutn signal is at logic low and is discharged by current source 242 with a current of Icp when the CKoutn signal is at logic high.

When steady state is reached, capacitor 234 is charged 50% of the time and is discharged 50% of the time (or else the voltage on capacitor 234 would integrate and saturate at either an upper or lower rail voltage). The voltage on capacitor 234 is varied such that the CKoutp signal has approximately 50% duty cycle and charges and discharges capacitor 234 about 50% of the time.

Duty cycle detection circuit 140a may be considered as a current steering charge pump. The right branch is a second branch that allows current source 220 to steer its current through either the left branch or the right branch at any given moment. This current steering results in the voltage at node A being held relatively constant regardless of whether the CKoutp signal is at logic high or logic low. Capacitors 234 and 244 may have the same or different capacitance values, and their exact values are not critical. Although not shown in FIG. 2 for simplicity, parasitic capacitors are present at various circuit nodes and can affect the charging and discharging of capacitor 234 via a phenomenon commonly referred to as charge sharing. Since node C is not connected within a feedback loop, the voltage at this node may drift into saturation at either the upper or lower rail voltage. Buffer 236 maintains the voltage at node C equal to the voltage at node B and prevents node C from drifting into saturation.

As shown in FIG. 2, clock deskew circuit 130a and duty cycle detection circuit 140a implement a feedback loop that senses distortion or error in the duty cycle of the CKoutp signal and feeds back the duty cycle control to correct the distortion. Duty cycle detection circuit 140a detects the duty cycle of the CKoutp signal and generates a charging/discharging current that is proportional to the detected error in the duty cycle. This charging/discharging current is integrated by capacitor 234 to generate the Vadj voltage. Clock deskew circuit 130a uses the Pctrl and Nctrl controls, which are generated from the Vadj voltage, to adjust the slew rate of the inverters 210a and 210c to correct the duty cycle error.

Figure 3:
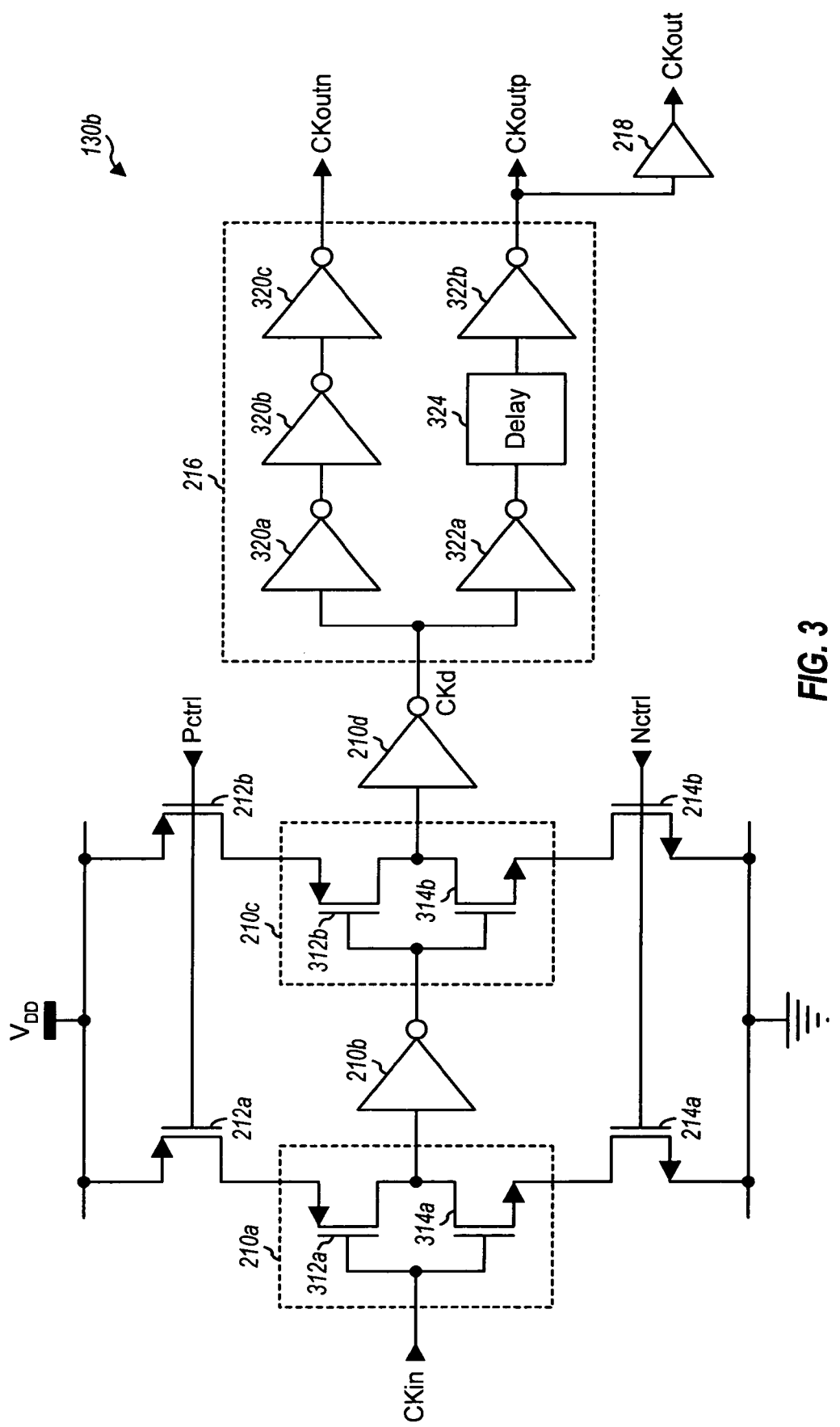
FIG. 3 shows an embodiment of the clock deskew circuit.

FIG. 3 shows a schematic diagram of a clock deskew circuit 130b, which is an embodiment of clock deskew circuit 130a in FIG. 2. Within circuit 130b, each of inverters 210a through 210d is formed with a P-FET 312 and an N-FET 314. P-FET 312 and N-FET 314 have their gates coupled together and forming the input of the inverter and their drains coupled together and forming the output of the inverter. The source of P-FET 312a for inverter 210a is coupled to the drain of pull-up P-FET 212a, and the source of P-FET 312b for inverter 210c is coupled to the drain of pull-up P-FET 212b. The source of N-FET 314a for inverter 210a is coupled to the drain of pull-down N-FET 214a, and the source of N-FET 314b for inverter 210c is coupled to the drain of pull-down N-FET 214b. P-FETs 212a and 212b control the pull up strength of inverters 210a and 210c, respectively. Correspondingly, N-FETs 214a and 214b control the pull down strength of inverters 210a and 210c, respectively. Although not shown in FIG. 3, inverters 210b and 210d may couple directly between the supply voltage and circuit ground.

Single-ended to differential converter 216 includes two paths for the CKoutn and CKoutp signals. The path for the CKoutn signal includes three inverters 320a, 320b and 320c coupled in series. Inverter 320a receives the deskewed clock signal, CKd, and inverter 320c provides the CKoutn signal. The path for the CKoutp signal includes an inverter 322a, a delay circuit 324, and an inverter 322b coupled in series. Inverter 322a receives the CKd signal, and inverter 322b provides the CKoutp signal. Delay circuit 324 provides a delay to match the delay of inverter 320b and may be implemented, e.g., with a capacitor connected to the output of inverter 322a.

Figure 4:
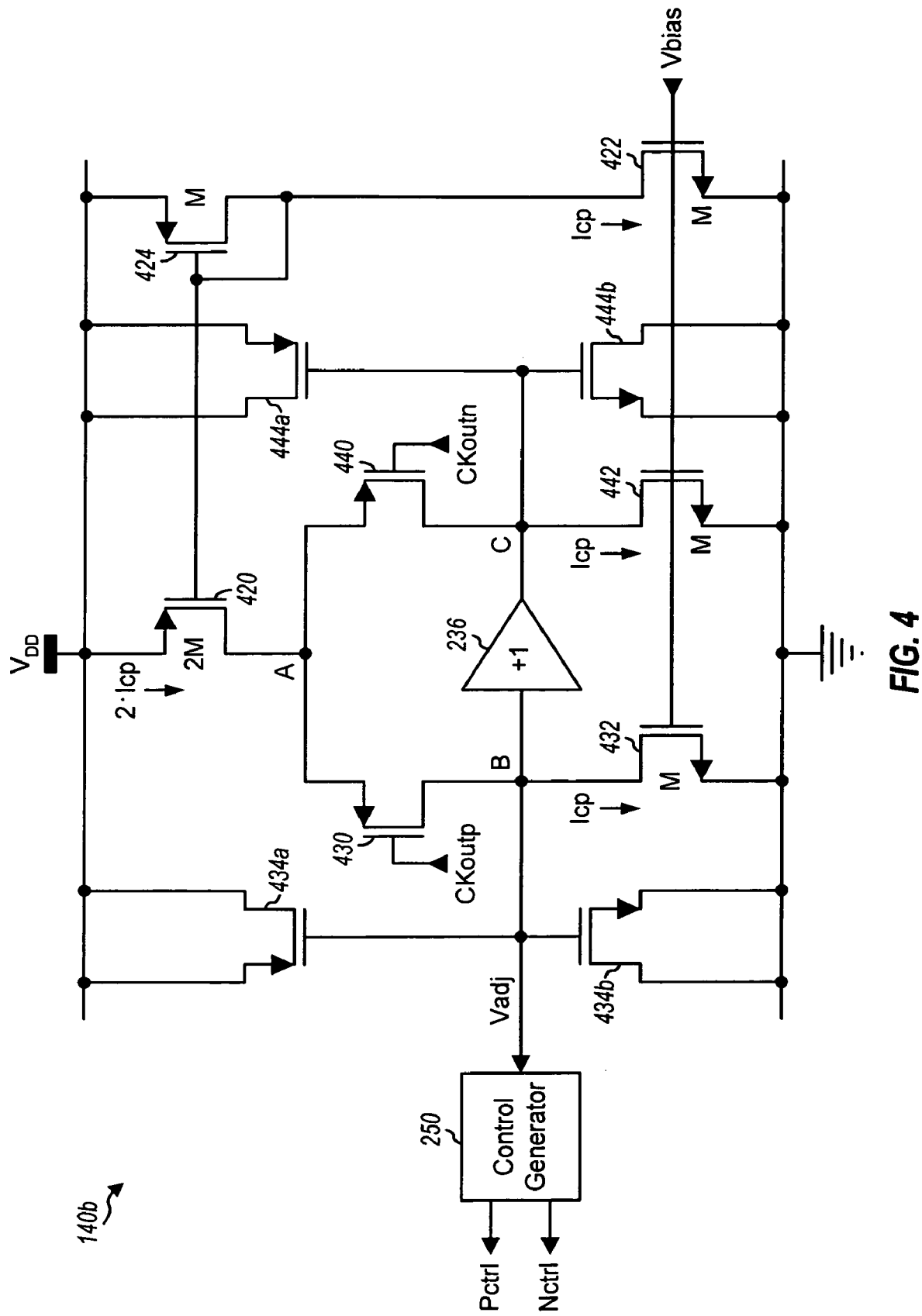
FIG. 4 shows an embodiment of the duty cycle detection circuit.

FIG. 4 shows a schematic diagram of a duty cycle detection circuit 140b, which is an embodiment of duty cycle detection circuit 140a in FIG. 2. Within circuit 140b, N-FETs 422, 432 and 442 have their sources coupled to circuit ground and their gates coupled together and receiving a bias voltage, Vbias. P-FETs 420 and 424 have their sources coupled to the supply voltage and their gates coupled together and further to the drain of N-FET 422. P-FETs 430 and 440 have their sources coupled together and to the drain of P-FET 420, their sources coupled to the drains of N-FETs 432 and 442, respectively, and their gates receiving the CKoutp and CKoutn signals, respectively. Unity gain buffer 236 has its input coupled to the drain of P-FET 430 and its output coupled to the drain of P-FET 440. P-FETs 434a and 444a have their sources and drains coupled to the supply voltage. N-FETs 434b and 444b have their sources and drains coupled to circuit ground. P-FET 434a and N-FET 434b have their gates coupled to the drain of P-FET 430, which provides the Vadj voltage for control generator 250. P-FET 444a and N-FET 444b have their gates coupled to the drain of P-FET 440.

In the embodiment shown in FIG. 4, P-FET 420 and N-FETs 432 and 442 correspond to current sources 220, 232 and 242, respectively, in FIG. 2. P-FETs 430 and 440 correspond to switches 230 and 240, respectively. FETs 434a and 434b form capacitor 234, and FETs 444a and 444b form capacitor 244.

N-FETs 422, 432 and 442 form a current mirror, and each of these N-FETs has a device size of M. The Vbias voltage determines the amount of current (Icp) flowing through N-FET 422. This same amount of current (Icp) flows through each of N-FETs 432 and 442 (because the N-FETs have the same device size) as well as through P-FET 424 (because of the circuit connection). P-FETs 420 and 424 also form a current mirror. Since P-FET 424 has a device size of M whereas P-FET 420 has a device size of 2M, the amount of current flowing through P-FET 420 is twice the amount of current flowing through P-FET 424.

Figure 5:
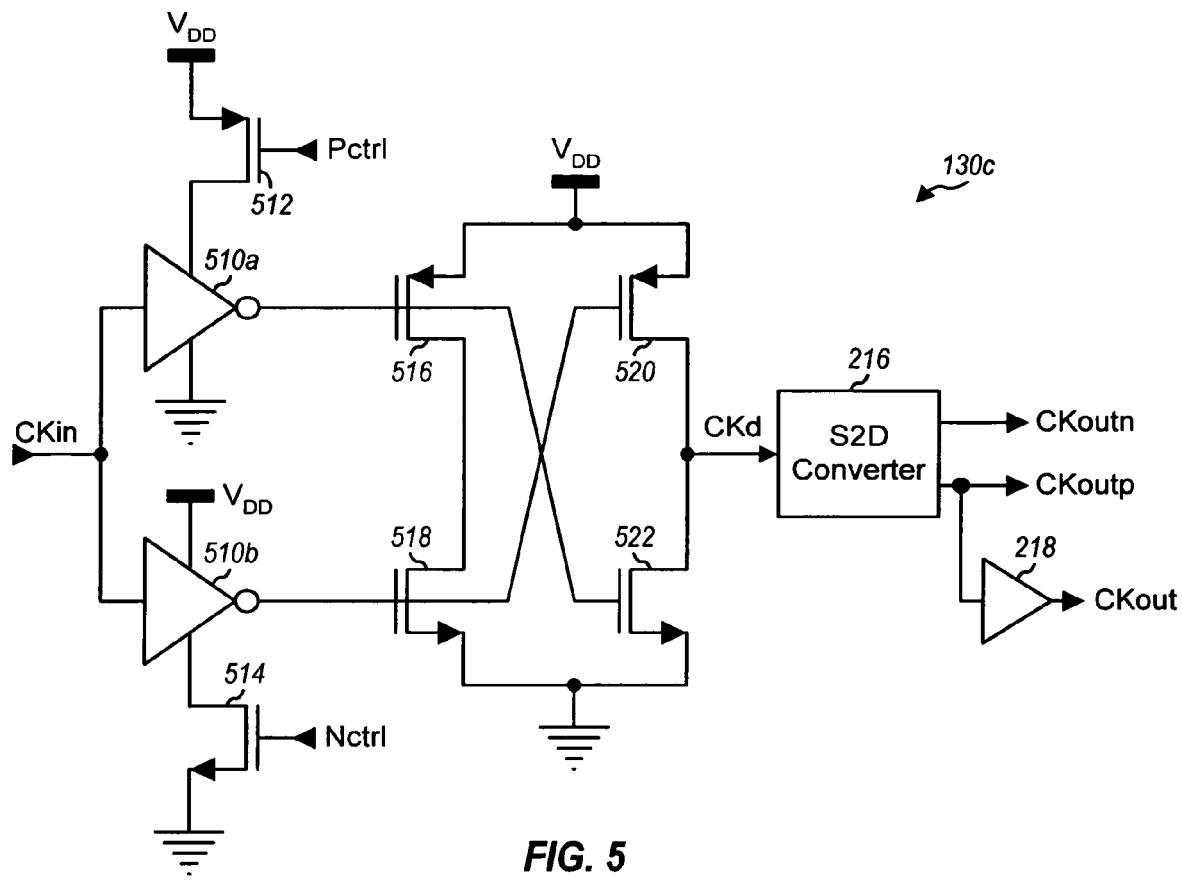
FIG. 5 shows another embodiment of the clock deskew circuit.

FIG. 5 shows a circuit diagram of a clock deskew circuit 130c, which is another embodiment of clock deskew circuit 130 in FIG. 1. Clock deskew circuit 130c may be used for low-voltage applications since only three FETs are stacked and connected between the supply voltage and circuit ground. In contrast, clock deskew circuit 130b in FIG. 3 has four stacked FETs.

Within clock deskew circuit 130c, inverters 510a and 510b are coupled in parallel and receive the CKin signal at their inputs. A pull-up P-FET 512 has its source coupled to the supply voltage, its gate receiving the Pctrl control, and its drain coupled to inverter 510a. A pull-down N-FET 514 has its source coupled to circuit ground, its gate receiving the Nctrl control, and its drain coupled to inverter 510b. Inverters 510a and 510b may each be implemented with a P-FET and an N-FET as shown in FIG. 3. The drain of pull-up P-FET 512 would then be coupled to the source of the P-FET for inverter 510a. The drain of pull-down N-FET 514 would be coupled to the source of the N-FET for inverter 510b.

An output circuit includes P-FETs 516 and 520 and N-FETs 518 and 522. P-FETs 516 and 520 have their sources coupled to the supply voltage and their gates coupled to the outputs of inverters 510a and 510b, respectively. N-FETs 518 and 522 have their sources coupled to circuit ground, their gates coupled to the outputs of inverters 510b and 510a, respectively, and their drains coupled to the drains of P-FETs 516 and 520, respectively. The drains of FETs 520 and 522 provide the deskewed clock signal, CKd.

P-FET 512 determines the pull up strength of inverter 510a and controls the slew rate of the rising edges of the output signal from inverter 510a. N-FET 514 determines the pull down strength of inverter 510b and controls the slew rate of the falling edges of the output signal from inverter 510b. Inverters 510a and 510b drive the gates of N-FET 522 and P-FET 520, respectively. The duty cycle of the CKd signal may be varied by adjusting P-FET 512 and N-FET 514 to obtain different slew rates and hence different propagation delays for the rising and falling edges. P-FET 516 and N-FET 518 match the output loads of inverters 510a and 510b.

With the Pctrl and Nctrl controls defined as shown in either equation (1) or equations (2) and (3), decreasing the Vadj voltage results in P-FET 512 turning on harder and N-FET 514 turning on softer. This then results in a faster rising edge slew rate for inverter 510a and a slower falling edge slew rate for inverter 510b. The converse is true for increasing Vadj voltage. The duty cycle of the CKd signal may thus be varied by adjusting the Vadj voltage, which varies the Pctrl control for P-FET 512 as well as the Nctrl control for N-FET 514.

In FIG. 5, inverters 510*a* and 510*b* and FETs 512 through 522 may be considered one stage. Multiple stages (e.g., 2, 4, 6, 8 or some other number of stages) may be coupled in series to provide the desired amount of duty cycle adjustment. The deskewed clock signal from the last stage may be provided to converter 216.

Figure 6:
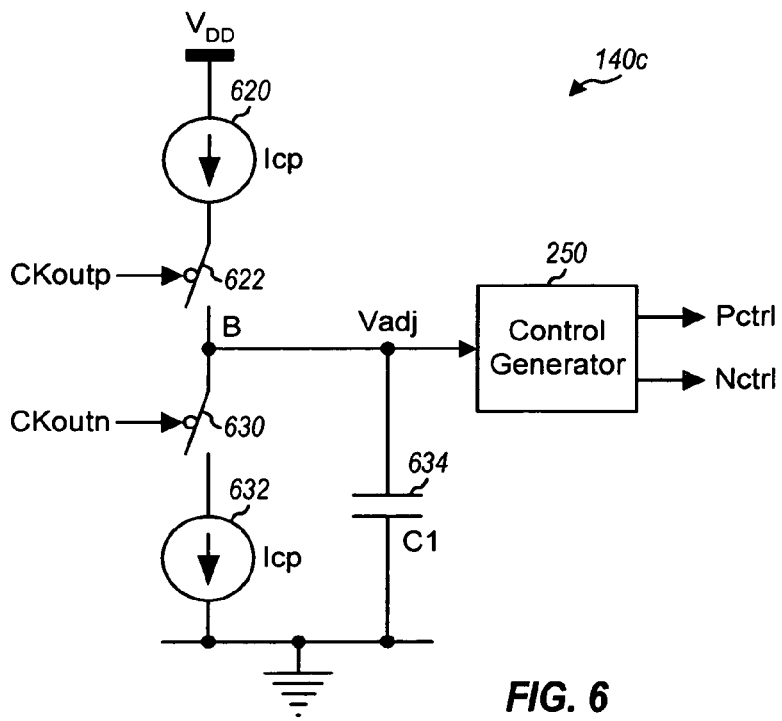
FIG. 6 shows another embodiment of the duty cycle detection circuit.

FIG. 6 shows a circuit diagram of a duty cycle detection circuit 140*c*, which is another embodiment of duty cycle detection circuit 140 in FIG. 1. Circuit 140*c* has fewer circuit components than duty cycle detection circuit 140*a* in FIG. 2 and may be suitable for some applications.

Within circuit 140*c*, a current source 620 and a switch 622 are coupled in series and between the supply voltage and node B. A switch 630 and a current source 632 are coupled in series and between node B and circuit ground. Switches 622 and 630 receive the CKoutp and CKoutn signals, respectively, at their control inputs. A capacitor 634 is coupled between node B and circuit ground. Control generator 250 receives the Vadj voltage at node B and generates the Pctrl and Nctrl controls for the clock deskew circuit.

Duty cycle detection circuit 140*c* operates as follows. When the CKoutp signal is at logic low and the CKoutn signal is at logic high, switch 622 is turned on and switch 630 is turned off. Current source 620 then provides a current of Icp through switch 622. This current charges capacitor 634. Conversely, when the CKoutp signal is at logic high and the CKoutn signal is at logic low, switch 622 is turned off and switch 630 is turned on. Current source 632 then sinks a current of Icp through switch 630. This current discharges capacitor 634. Thus, capacitor 634 is charged by current source 620 with a current of Icp when the CKoutp signal is at logic low and is discharged by current source 632 with a current of Icp when the CKoutn signal is at logic low. When steady state is reached, capacitor 644 is charged about 50% of the time and is discharged about 50% of the time.

Several embodiments of clock deskew circuit 130 and duty cycle detection circuit 140 have been described above. Circuits 130 and 140 may also be implemented with other designs, and this is within the scope of the present invention. In general, clock deskew circuit 130 may be any circuit that can adjust the duty cycle of a clock signal based on a duty cycle control. The duty cycle adjustment may be achieved by varying the slew rates of the rising and falling edges of inverters, as described above. The duty cycle adjustment may also be achieved with other mechanisms, e.g., by passing the CKin signal through multiple paths with different duty cycles and selecting one path based on the control from the duty cycle detection circuit.

Duty cycle detection circuit 140 may be any circuit that can detect the duty cycle of the clock signal and generate the duty cycle control. The duty cycle detection may be achieved by charging and discharging a capacitor, as described above, or by other mechanisms. The duty cycle control may be given in any form, e.g., as one or more digital signals, one or more voltages, one or more currents, and so on.

The embodiments shown in FIGS. 2 through 6 correct error in clock duty cycle using a feedback mechanism. The problem of matching transistor devices in a high-speed clock path is essentially converted into a problem of matching transistor devices in a low-speed charge pump. This may substantially reduce power consumption. Furthermore, the embodiments described above reduce the number of possible sources of duty cycle error.

Figure 7:
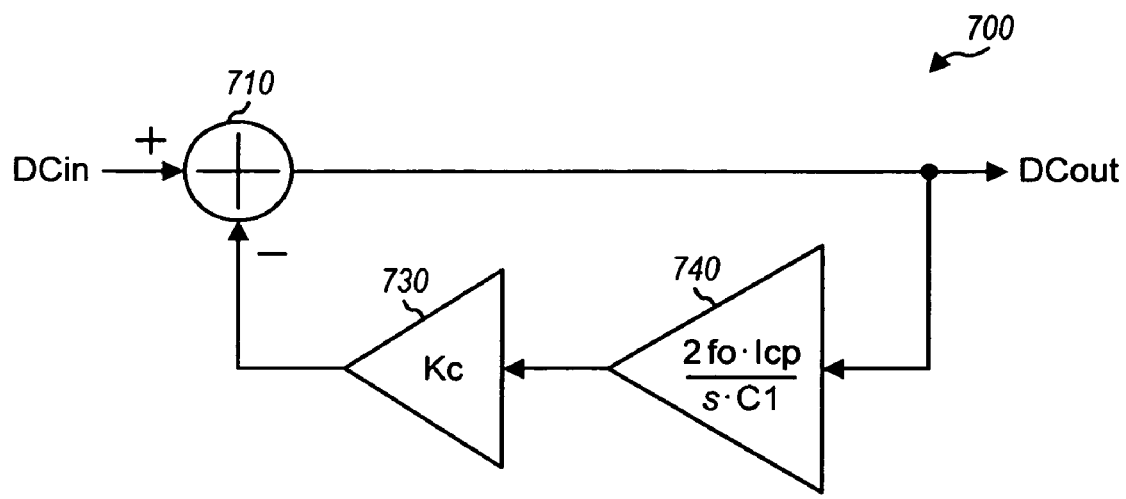
FIG. 7 shows a linear model of the duty cycle correction circuit.

FIG. 7 shows a diagram of a linear model 700 of duty cycle correction circuit 120 in FIG. 1. Model 700 includes a summer 710, a gain element 730 that models clock deskew circuit 130, and an integrator 740 that models duty cycle detection circuit 140.

The CKin signal received by clock deskew circuit 130 has a duty cycle of DCin, and the CKout signal provided by clock deskew circuit 130 has a duty cycle of DCout. DCin and DCout may each be given in terms of absolute time deviation from 50% duty cycle. Summer 710 subtracts a duty cycle adjustment, DCadj, from DCin and provides DCout, which may be expressed as:

$$DCout = DCin - DCadj = DCin - Kc \cdot Vadj, \qquad \text{Eq (4)}$$

where Kc is a constant that is dependent on the design of the clock deskew circuit. The minus sign in equation (4) ensures negative feedback.

Duty cycle detection circuit 140 may be implemented with an integrator that is controlled by clock phases, as shown by the embodiments in FIGS. 2, 4 and 6. In these embodiments, the output of circuit 140 ramps up linearly with a slope of Icp/C1 on one clock phase and ramps down linearly with the same slope on the opposite clock phase. The slope is determined by the charging/discharging current (Icp) for the capacitor used for integration and the value (C1) of the capacitor. If the clock duty cycle deviates from 50% by Δt, then the average charging/discharging current, Io, over one clock period may be expressed as:

$$Io = (2 \Delta t \cdot fo) \cdot Icp, \qquad \text{Eq (5)}$$

where fo is the clock frequency. As a continuous-time approximation, the average value of the Vadj voltage may be expressed as:

$$Vadj = \frac{Io}{s \cdot C1}, \qquad \text{Eq (6)}$$

where s is a Laplace variable.

The transfer function of duty cycle detection circuit 140, Hcp(s), may then be expressed as:

$$Hcp(s) = \frac{Vadj}{\Delta t} = \frac{Io}{s \cdot C1 \cdot \Delta t} = \frac{2 \cdot fo \cdot Icp}{s \cdot C1}. \qquad \text{Eq (7)}$$

Integrator 740 receives the output clock duty cycle, DCout, applies the transfer function Hcp(s), and provides the Vadj voltage. Gain element 730 scales the Vadj voltage by Kc and provides DCadj.

The closed-loop transfer function, H(s), for model 700 may be expressed as:

$$H(s) = \frac{DCout}{DCin} = \frac{s}{s + \frac{2 \cdot fo \cdot Kc \cdot Icp}{C1}}. \qquad \text{Eq (8)}$$

The closed-loop bandwidth of H(s), BW, may be expressed as:

$$BW = \frac{fo \cdot Kc \cdot Icp}{\pi \cdot C1}. \qquad \text{Eq (9)}$$

For a given clock frequency, fo, and a given clock deskew circuit gain, Kc, the desired closed-loop bandwidth may be obtained by selecting the proper charging/discharging current Icp and the proper value for the capacitor C1. In one exemplary design, with a clock frequency of 500 MHz, Kc=1.3 nsec/V, Icp=20 µA, C1=2 pF, and the closed-loop bandwidth is approximately 2 MHz.

Figure 8:
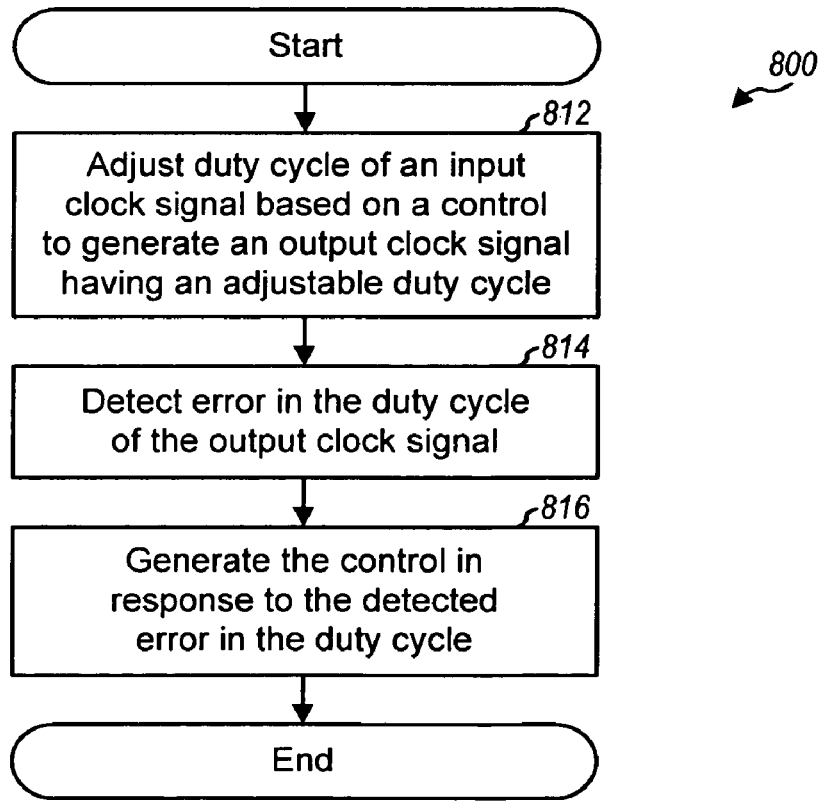
FIG. 8 shows a process for generating a clock signal with good duty cycle.

FIG. 8 shows an embodiment of a process 800 for generating a clock signal with good duty cycle. The duty cycle of an input clock signal is adjusted based on a control to generate an output clock signal having an adjustable duty cycle (block 812). Error in the duty cycle of the output clock signal is detected (block 814). The control is generated in response to the detected error in the duty cycle (block 816).

The duty cycle adjustment may be performed using various circuits. For example, one or more inverters may be used to adjust the duty cycle of the input clock signal. One or more pull-up transistors (e.g., P-FETs) may be used to adjust the rising edge slew rate of the inverters. Alternatively or additionally, one or more pull-down transistors (e.g., N-FETs) may be used to adjust the falling edge slew rate of the inverters. The pull-up and pull-down transistors may operate on the same inverters (e.g., as shown in FIGS. 2 and 3) or on different inverters (e.g., as shown in FIG. 5). The pull-up and pull-down transistors may receive the same or different control voltages.

The duty cycle error detection may also be performed using various circuits. For example, a capacitor may provide a voltage indicative of the duty cycle error, a first current source may provide a charging current for the capacitor, and a second current source may provide a discharging current for the capacitor. The duty cycle error detection may be achieved by operating a switch with the output clock signal and charging or discharging the capacitor with the switch. An additional set of capacitor, current source, and switch may be used for a current steering charge pump design, e.g., as shown in FIGS. 2 and 4.

The duty cycle correction circuit described herein may be used for various electronics circuits. The use of the duty cycle correction circuit in a wireless communication device is described below.

Figure 9:
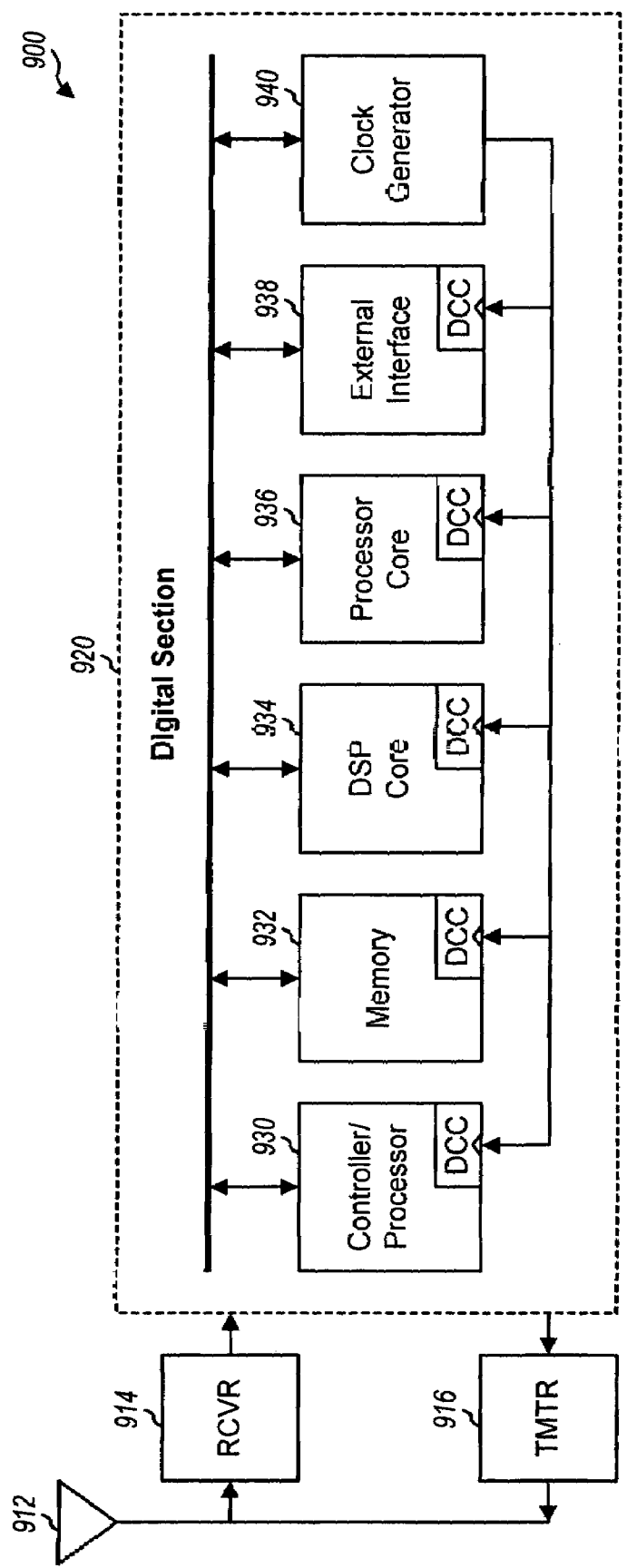
FIG. 9 shows a wireless device with the duty cycle correction circuit.

FIG. 9 shows a block diagram of a wireless device 900, which may be may be a cellular phone, a terminal, a personal digital assistant (PDA), a handset, or some other device. Wireless device 900 may be able to communicate with various wireless communication systems such as CDMA, TDMA, FDMA, GSM, OFDMA, GPS and/or other systems known in the art.

On the receive path, an antenna 912 receives signals transmitted by base stations and/or satellites and provides a received signal to a receiver (RCVR) 914. Receiver 914 processes (e.g., filters, amplifies, frequency downconverts, and digitizes) the received signal and provides samples to a digital section 920 for further processing. On the transmit path, digital section 920 processes data to be transmitted and provides data chips to a transmitter (TMTR) 916. Transmitter 916 processes (e.g., converts to analog, filters, amplifies, and frequency upconverts) the data chips and generates a modulated signal, which is transmitted via antenna 912.

Digital section 920 includes various processing units that support communication and/or other functions. Within digital section 920, a digital signal processor (DSP) core 934 performs processing (e.g., encoding and modulation) for the transmit path, processing (e.g., demodulation and decoding) for the receive path, and/or processing for other applications and functions. A processor core 936 supports various functions such as video, audio, graphics, gaming, and so on. A controller/processor 930 directs the operation of the processing units within digital section 920. A memory 932 stores data and program codes for the processing units. An external interface unit 938 interfaces with other units external to digital section 920.

A clock generator 940 generates clock signals used by the processing units within digital section 920. Clock generator 940 may include one or more VCOs and/or PLLs to generate the clock signals. Clock generator 940 distributes clock signals to other processing units within digital section 920. The clock distribution network is represented by the lines going from clock generator 940 to other processing units. Duty cycle correction circuits (DCCs) may be implemented in controller/processor 930, memory 932, DSP core 934, processor core 936, interface unit 938, and/or other units.

The duty cycle correction circuit described herein may be used to improve the duty cycle of a clock signal from an oscillator, a PLL, a clock distribution network, or some other clock source. The duty cycle correction circuit can generate an output clock signal having good duty cycle, e.g., close to 50%. Duty cycle may be an important specification of the clock signal and may be more important for higher clock rates used in many modern day electronics devices. The duty cycle correction circuit can be conveniently implemented in any part of an integrated circuit and used to correct clock duty cycle wherever needed. Any number of duty cycle correction circuits may be implemented on a given integrated circuit.

The duty cycle correction circuit described herein may provide various advantages. The circuit can automatically and continuously correct errors in clock duty cycle. The circuit may be powered using an available power supply (e.g., the supply voltage for digital circuits) and does not require an accurate external bias. The circuit may be implemented using standard circuit components (e.g., transistor devices) in a small silicon area. The circuit also consumes relatively little power.

The duty cycle correction circuit described herein may be implemented in an integrated circuit (IC), an application specific integrated circuit (ASIC), a digital signal processor (DSP), a digital signal processing device (DSPD), a programmable logic device (PLD), a field programmable gate array (FPGA), a processor, a controller, a micro-controller, a microprocessor, and other electronic units. The duty cycle correction circuit may also be fabricated using various IC process technologies such as CMOS, N-MOS, P-MOS, BJT, GaAs, and so on. The duty cycle correction circuit may also be implemented with discrete components.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A device comprising:
   a first circuit configured to adjust duty cycle of an input clock signal based on a common control voltage and provide an output clock signal having adjustable duty cycle; and
   a second circuit configured to detect error in the duty cycle of the output clock signal and to generate the common control voltage in response to the detected error in the duty cycle;

wherein
the first circuit comprises a first inverter and a second inverter configured to adjust the duty cycle of the input clock signal, a pull-up transistor coupled to the first inverter and configured to adjust rising edge slew rate of the first inverter based on a first control voltage, and a pull-down transistor coupled to the first inverter and configured to adjust falling edge slew rate of the first inverter based on a second control voltage; and
the second circuit comprises a control generator configured to generate the first and second control voltages as level shifted versions of the common control voltage, the first control voltage being lower than the second control voltage.

2. A device comprising:
a first circuit configured to adjust duty cycle of an input clock signal based on a common control voltage and provide an output clock signal having adjustable duty cycle; and
a second circuit configured to detect error in the duty cycle of the output clock signal and to generate the common control voltage in response to the detected error in the duty cycle;
wherein the first circuit comprises:
a first inverter and a second inverter configured to adjust the duty cycle of the input clock signal,
a pull-up transistor coupled to the first inverter and configured to adjust rising edge slew rate of the first inverter,
a pull-down transistor coupled to the second inverter and configured to adjust falling edge slew rate of the second inverter, and
an output circuit coupled to the first and second inverters and configured to generate an output signal having adjustable duty cycle.

3. The device of claim 2, wherein the pull-up transistor receives a first control voltage and the pull-down transistor receives a second control voltage, and wherein the first and second control voltages are level shifted versions of the common control voltage.

4. The device of claim 2, wherein the first inverter and the pull-up transistor comprise three stacked transistors coupled between a power supply voltage and circuit ground, and wherein the second inverter and the pull-down transistor comprise three stacked transistors coupled between the power supply voltage and circuit ground.

5. A device comprising:
a first circuit configured to adjust duty cycle of an input clock signal based on a control and provide an output clock signal having adjustable duty cycle; and
a second circuit configured to detect error in the duty cycle of the output clock signal and to generate the control in response to the detected error in the duty cycle;
wherein the first circuit includes a first inverter and a second inverter configured to adjust the duty cycle of the input clock signal; and
wherein the second circuit comprises
a first capacitor configured to provide a voltage indicative of the error in the duty cycle of the output clock signal,
a first current source configured to provide a charging current for the first capacitor,
a second current source configured to provide a discharging current for the first capacitor,
a first switch coupled between the first current source and the first capacitor and configured to receive the output clock signal, and wherein the first capacitor is coupled in parallel with the second current source,
a second capacitor,
a third current source coupled in parallel with the second capacitor, and
a second switch coupled between the first current source and the third current source and configured to receive an inverted output clock signal.

6. The device of claim 5, wherein the second circuit further comprises
a buffer having an input coupled to the first capacitor and an output coupled to the second capacitor.

7. An integrated circuit comprising:
a first circuit configured to adjust duty cycle of air input clock signal based on a control and provide an output clock signal having adjustable duty cycle; and
a second circuit configured to detect error in the duty cycle of the output clock signal and to generate the control in response to the detected error in the duty cycle;
wherein the first circuit includes a first inverter and a second inverter configured to adjust the duty cycle of the input clock signal; and
wherein the second circuit comprises:
a first capaciter configured to provide a voltage indicative of the error in the duty cycle of the output clock signal,
a first current source configured to provide a charging current for the first capacitor, and
a second current source configured to provide a discharging current for the first capacitor,
a second capacitor,
a third current source coupled in parallel with the second capacitor,
a first switch coupled between the first current source and the first capacitor and configured to receive the output clock signal, and
a second switch coupled between the first current source and the second capacitor and configured to receive an inverted output clock signal, and wherein the first capacitor is coupled in parallel with the second current source.

8. The integrated circuit of claim 7, wherein the first circuit further comprises a pull-up transistor coupled to the first inverter and configured to adjust rising edge slew rate of the first inverter.

9. The integrated circuit of claim 7, wherein the first circuit further comprises a pull-down transistor coupled to the first inverter and configured to adjust falling edge slew rate of the first inverter.

10. The integrated circuit of claim 7, wherein the first and second circuits are implemented with N-channel field effect transistors (N-FETs) and P-channel field effect transistors (P-FETs).

11. The integrated circuit of claim 7, wherein the first capacitor is implemented with at least one field effect transistor (FET).

12. A wireless device comprising:
the integrated circuit of claim 7; and
a clock generator configured to generate the input clock signal.

13. The integrated circuit of claim 7, wherein the first inverter is coupled to at least one of (a) a pull-up transistor and (b) a pull-down transistor, and the second inverter is coupled to at least one of (a) a pull-up transistor and (b) a pull-down transistor 14. A method comprising:
adjusting duty cycle if an input clock signal based on a control to generate an output clock signal having adjustable duty cycle;
detecting error in the duty cycle of the output clock signal; and generating the control in response to the detected error in the duty cycle, wherein adjusting the duty cycle of the input clock signal includes adjusting rising edge slew rate or falling edge slew rate of a first inverter and a second inverter, and wherein detecting error in the duty cycle of the output clock signal comprises:
charging a first capacitor with a charging current for a first logic level of the output clock signal;
discharging the first capacitor with a discharging current for a second logic level of the output clock signal;
charging a second capacitor with a charging current for the second logic level of the output clock signal; and
discharging the second capacitor with a discharging current for the first logic level of the output clock signal.

15. An apparatus comprising:
means for adjusting duty cycle of an input clock signal based on a control to generate an output clock signal having adjustable duty cycle;
means for detecting error in the duty cycle of the output clock signal; and
means for generating the control in response to the detected error in the duty cycle,
wherein the adjusting means includes: (1) means for adjusting rising edge slew rate of a first inverter, or means for adjusting falling edge slew rate of a first inverter, and (2) means for adjusting rising edge slew rate of a second inverter, or means for adjusting falling edge slew rate of a second inverter, and
wherein means for detecting error in the duty cycle of the output clock signal comprises:
means for charging a capacitor with a charging current for a first logic level of the output clock signal;
means for discharging the capacitor with a discharging current for a second logic level of the output clock signal;
means for charging a second capacitor with a charging current for the second logic level of the output clock signal; and
means for discharging the second capacitor with a discharging current for the first logic level of the output clock signal.

16. A wireless device comprising:
a clock generator configured to generate an input clock signal; and
at least one duty cycle correction circuit, each duty cycle correction circuit configured to:
receive the input clock signal,
adjust duty cycle of the input clock signal based on a control to generate an output clock signal having adjustable duty cycle,
detect error in the duty cycle of the output clock signal, and
generate the control in response to the detected error in the duty cycle,
wherein adjusting the duty cycle includes adjusting rising edge slew rate or falling edge slew rate of a first inverter and a second inverter, and
wherein each duty cycle correction circuit configured to detect error in the duty cycle of the output clock signal is further configured to:
charge a first capacitor with a charging current for a first logic level of the output clock signal;
discharge the first capacitor with a discharging current for a second logic level of the output clock signal;
charge a second capacitor with a charging current for the second logic level of the output clock signal; and
discharge the second capacitor with a discharging current for the first logic level of the output clock signal.

17. The wireless device of claim 10, further comprising:
a digital signal processor (DSP) core comprising the at least one duty cycle correction circuit.

18. The wireless device of claim 10, further comprising:
a processor core comprising the at least one duty cycle correction circuit.

* * * * *